(12) United States Patent
Weidinger et al.

(10) Patent No.: US 8,388,792 B2
(45) Date of Patent: Mar. 5, 2013

(54) NONSTICK MATERIAL, METHOD FOR REMOVING A PART OF A PLANAR MATERIAL LAYER AND MULTILAYER STRUCTURE AND USE THEREFOR

(75) Inventors: Gerald Weidinger, Vienna (AT); Günther Weichslberger, Graz (AT); Markus Leitgeb, Trofaiach (AT); Johannes Stahr, Bruck (AT)

(73) Assignee: AT & S Austria Technologie & Systemtechnik Aktiengesellschaft, Leoben-Hinterberg (AT)

( * ) Notice: Subject to any disclaimer, the term of this patent is extended or adjusted under 35 U.S.C. 154(b) by 683 days.

(21) Appl. No.: 12/449,606

(22) PCT Filed: Jan. 30, 2008

(86) PCT No.: PCT/AT2008/000029
§ 371 (c)(1),
(2), (4) Date: Aug. 17, 2009

(87) PCT Pub. No.: WO2008/098271
PCT Pub. Date: Aug. 21, 2008

(65) Prior Publication Data
US 2010/0009178 A1    Jan. 14, 2010

(30) Foreign Application Priority Data

Feb. 16, 2007 (AT) ............... GM 100/2007
Dec. 3, 2007 (AT) ............... GM 727/2007

(51) Int. Cl.
*B32B 37/26*    (2006.01)
*B32B 38/10*    (2006.01)
*B32B 38/04*    (2006.01)
*C08J 5/16*    (2006.01)
*C09J 5/02*    (2006.01)
*B29C 63/48*    (2006.01)

(52) U.S. Cl. ........ 156/247; 156/248; 156/257; 156/286; 156/307.1; 156/307.5; 156/307.7; 156/719

(58) Field of Classification Search ............... 156/247, 156/248, 250, 257, 289, 307.1, 307.5, 307.7, 156/701, 719; 361/600, 610, 657; 29/846, 29/852
See application file for complete search history.

(56) References Cited

U.S. PATENT DOCUMENTS

| | | | |
|---|---|---|---|
| 5,144,534 A | 9/1992 | Kober | |
| 6,245,382 B1 | 6/2001 | Shvartsman et al. | |

FOREIGN PATENT DOCUMENTS

| | | |
|---|---|---|
| DE | 40 03 344 | 6/1991 |
| DE | 202 21 189 | 6/2005 |
| WO | WO 2004/030429 | 4/2004 |

OTHER PUBLICATIONS

International Search Report dated Jun. 25, 2008.

*Primary Examiner* — Sing P Chan
(74) *Attorney, Agent, or Firm* — Jacobson Holman PLLC

(57) ABSTRACT

The invention relates to a nonstick material for use during removal of a part (11) of a substantially planar material layer (2) which is connected in a connecting step to at least on further, substantially planar material layer (9). According to the invention, the nonstick material (8) has a different polarity than the adjoining, substantially planar material layers (2, 9). The invention also relates to a method for removing a part (11) of a substantially planar material layer (2) which is connected in a connecting step to at least one further, substantially planar material layer (9), to a multilayer structure which consists of at least two substantially planar material layers (2, 9) to be interconnected, and to a use of the same, especially in a multilayer printed circuit board.

5 Claims, 4 Drawing Sheets

NONSTICK MATERIAL, METHOD FOR REMOVING A PART OF A PLANAR MATERIAL LAYER AND MULTILAYER STRUCTURE AND USE THEREFOR

This is a national stage of PCT/AT08/000029 filed Jan. 30, 2008 and published in German, which has a priority of Austrian no. G 100/2007 filed Feb. 16, 2007 and Austrian no. GM 727/2007 filed Dec. 3, 2007, hereby incorporated by reference.

FIELD OF THE INVENTION

The present invention relates to an adhesion-preventing or anti-adhesion or nonstick material for use in the removal of a part or subportion of a substantially flat or planar material layer which is bonded with at least one further substantially flat material layer in a bonding procedure by raising the temperature. The invention, moreover, relates to a method for removing a part or subportion of a substantially flat or planar material layer which is bonded with at least one further substantially flat or planar material layer in a bonding procedure by raising the temperature, a multilayer structure formed by at least two substantially flat material layers to be bonded with each other, and the use therefor, in particular, in the context of the production of a multilayer printed circuit board.

PRIOR ART

A method and an anti-adhesion or nonstick material of the kind mentioned-above can for example be taken from U.S. Pat. No. 6,245,382 B or DE 40 03 344 C, wherein in particular with DE 40 03 344 C it is aimed at providing a simple method for the production of a rigid-flexible printed circuit board.

Although the subsequent description at least partially refers to the production of a multilayer printed circuit board, it should be noted that the method according to the invention as well as the single- or multilayer structure according to the invention may be used in the most diverse applications, wherein it is aimed to remove a subportion or part from a substantially flat or planar material layer after bonding with at least one further substantially flat or planar material layer. In general, the present invention is applicable in connection with multilayer structures in which, after the production of a multilayer structure, a subportion is to be stripped, or one of the layers is to be removed. In this context, complex methods and constructions are, for instance, known, which, in particular, on account of the preconfectioning of at least one bonding layer used to bond the material layers to be bonded and the high operation expenditures involved as well as the accordingly high expenditures required for the subsequent proper orientation or registration of the material layers to be bonded, aim to strip or remove partial portions or subportions from such material layers after bonding. The substantially flat material layers may, for instance, be comprised of paper-like or cardboard-like layers or elements to be bonded, substantially plate-shaped or sheet-shaped element such as, e.g., foils, sheets or metal plates or the like. In the context of bonding substantially flat or plate-shape materials, it is, for instance, known, in particular with a view to an optionally subsequently required removal of at least a subportion thereof, to accordingly preconfection foils having adhesive properties such that subportions of the foils which, during a bonding procedure, are to ensure the adhesion of the material layers to be bonded are provided with recesses. In addition to substantially continuous adhesive foils, preconfectioned separation foils may alternatively be used as a function of the subportion to be subsequently removed. It is immediately apparent that the preconfectioning of such bonding foils or adhesive foils and/or separation foils involves accordingly high expenditures and, in addition, makes accordingly high demands on the registration and orientation of the material layers to be bonded via the interposition of such, in particular preconfectioned, foils.

In the context of the production of multilayer electronic components and, in particular, multilayer printed circuit boards, the design of such electronic components, which has increased in complexity during the past years, has generally led to an increase in the number of bonding points between active components and components of a printed circuit board, wherein the increasing reduction of size has, at the same time, entrained a reduction of the distance between such bonding points. In the context of the production of printed circuit boards, the disentanglement of such component bonding points by microvias through several circuit board layers in so-called high density interbonds (HDI) has been proposed.

In addition to an increase in the complexity of the design and construction of printed circuit boards and the miniaturization involved, further requirements with a view to providing foldable or bendable bonds in a circuit board have come up, which have led to the development of a hybrid technology and the use of so-called rigid-flexible printed circuit boards. Such rigid-flexible printed circuit boards comprising rigid portions or subportions of the printed circuit board as well as flexible portions bonding such rigid portions, have enhanced reliability, offered other or additional options of freedom in terms of design and construction, and enabled further miniaturization.

For the production of such rigid-flexible printed circuit boards, bonding layers corresponding with the rigid and flexible portions of a circuit board and made of dielectric materials are to be provided between said portions, whereby the arrangement of appropriate sheet-shaped layers or films which, for instance by heat treatment, cause the bonding of circuit board rigid and flexible portions to be bonded will usually result in comparatively thick layers. Such thick layers not only counteract the intended miniaturization in the fabrication of multilayer circuit boards, but also entail losses of the registering accuracy required for subsequent laser borehole geometries for the formation of microvias and accordingly narrowly spaced-apart connection or bonding sites. Such thick, known layers of non-conductive material, or dielectric layers, moreover, involve additional processing or process steps and/or more complex designs for the production of the connections required between the rigid and flexible portions of circuit boards, since, in particular, the appropriate preconfectioning or formatting is to be performed as a function of the subsequent division of the rigid portions of the printed circuit board.

SUMMARY OF THE INVENTION

While avoiding the problems of the above-mentioned prior art regarding, in particular, the preconfectioning or formatting of bonding elements or foils, or separation foils, when producing a bond between at least two flat or planar material layers, the present invention aims to provide an anti-adhesion or nonstick material which is simple and reliable to produce and use and process. In addition, the invention aims to provide a method for removing a subportion of a substantially flat material layer as well as a multilayer structure and its use, which are accordingly simple and reliable to perform and produce, respectively, in particular by using such an anti-adhesion material according to the invention.

To solve these objects, an anti-adhesion or nonstick material of the initially defined kind is substantially characterized in that the anti-adhesion material comprises a difference in polarity relative to the adjoining substantially flat or planar material layers. It is thereby feasible in a simple and reliable manner to prevent the material layers to be bonded from adhering in the region of the subportion to be subsequently removed, so that expensive confectioning and positioning steps as required in the prior art, for instance when using the respective adhesive foils or separation foils, can be obviated, wherein the anti-adhesion material according to the invention can be applied or arranged in a simple and reliable manner as a function of the subportion or part to be subsequently removed. The prevention of an adherence, or separation effect, is substantially based on the incompatibility, and difference in polarity, between the material of the adjoining, substantially flat material layers and the anti-adhesion material. In this respect, a nonpolar compound should possibly be used for the anti-adhesion material or adhesion-preventing material, wherein, for instance, waxes of natural or synthetic origin are suitable for this purpose as will be explained in more detail below.

In order to enable the particularly simple and reliable processing of the adhesion-preventing material or anti-adhesion material, it is provided according to a preferred embodiment that the anti-adhesion material comprises a separation component, a binder and a solvent. The separation component ensures that an adhesion in the region of the subportion to be subsequently removed, between the material layers to be bonded will be reliably prevented. The binder, in particular, serves to fix the anti-adhesion material to the support, or one of the material layers to be bonded, during the bonding procedure and adjust a rheology which will enable a perfect and problem-free application. Moreover, such a binder will, for instance, migrate into the material of an adjoining flat material layer so as to further enhance the separation effect, or adherence-preventing action. The solvent, for instance, serves to enable the simple and reliable processing of the anti-adhesion material.

In this context, it is proposed according to a further preferred embodiment that the anti-adhesion material comprises hydrocarbon waxes and oils, waxes and oils based on polyethylene or polypropylene compounds, waxes and oils based on organic polyfluoro-compounds, esters of fatty acids and alcohols or polyamides, silicoorganic compounds and/or mixtures thereof. Such waxes and oils, as a function of the purpose of use, are available in large numbers in different configurations and with different chemical and physical properties so as to be selectable as a function of the material layers to be bonded. The hydrocarbon waxes and oils may be of synthetic or natural origin such as, e.g., paraffins. In addition to, in particular, synthetic waxes and oils based on polyethylene or polypropylene compounds, modifications of this product group may also be employed. As far as synthetic waxes and oils based on polyfluoro-organic compounds or organic polyfluoro-compounds are concerned, PTFE may be cited as an example. Waxes and oils based on esters of fatty acids, and mono- or polyvalent alcohols, may be of synthetic or natural origin such as, e.g., palmitic or stearic acid derivatives, carnauba wax or the like. Examples of silicoorganic compounds, for instance, include silicone and silicone oil.

To enable the simple application of the anti-adhesion material according to the invention as well as the reliable formation of a portion to be kept free from bonding between the material layers to be bonded, which is provided in the region of the subportion to be subsequently removed, it is proposed according to a further preferred embodiment that the anti-adhesion material is comprised of a paste. Such a paste or waxy paste can, in a simple and reliable manner and accordingly precisely as a function of the subsequent separation or removal of the subportion, be reliably and precisely applied on or to one of the material layers to be bonded so as to enable, at an accordingly simplified process control, after bonding of the material layers to be bonded, the simple removal of said subportion, since in the region of the subportion to be subsequently removed an accordingly unbonded area, or portion free of an adhering bond between the material layers, will be provided by the application of the adhesion-preventing material in the form of a waxy paste.

For a particularly simple and position-precise application of the portion to be kept free from bonding with a view to the subsequent removal of a subportion of one of the material layers, it is proposed according to a further preferred embodiment that the anti-adhesion material is applicable by a printing process and, in particular, screen-printing, stencil-printing, offset printing, flexoprinting, tampon printing, ink-jet printing or the like.

For simple processing, such waxy pastes can, for instance, be applied in the form of micro-dispersions in polar or nonpolar organic solvents.

In order to facilitate the application and handling, in particular, of the material layers to be bonded, it is, moreover, proposed that the anti-adhesion material is provided with inorganic and/or organic fillers and additives, as in correspondence with a further preferred embodiment.

In order to obtain the desired separation effect by non-bonding through the application of the anti-adhesion material, it is proposed according to a further preferred embodiment that the anti-adhesion material has a softening or melting point of at least 100° C. and, in particular, 120° C. Such a high softening or melting point of the layer of anti-adhesion material will, for instance in the production of a printed circuit board, cause the additionally applied adhesive layers to cure during a lamination procedure and, at a further increase in temperature during the bonding or pressing cycle, the anti-adhesion material or adhesion preventing material according to the invention to liquefy, thus safeguarding that the non-bond area provided by the anti-adhesion material and required to enable the subsequent removal of the subportion will be reliably maintained. During the bonding procedure, the anti-adhesion material, by the formation of a liquid layer in the subportion to be subsequently removed will prevent continuous bonding, for instance gluing together, of the material layers to be bonded.

In order to obtain desiredly thin layer thicknesses while maintaining the bond-free area of the subportion to be removed, or preventing the adherence of the same, as provided by the invention, it is proposed according to a further preferred embodiment that the anti-adhesion material is applicable in a layer thickness of less than 25 μm and, in particular, less than 15 μm. Yet, layer thicknesses of up to 50 μm or, optionally, even more may also be envisaged.

In the context of providing a comparatively high softening point for the anti-adhesion material according to the invention, which comprises a solvent amongst others, it is proposed according to a further preferred embodiment that the solvent has a boiling point of less than 220° C. and, in particular, about 180 to 200° C. This will ensure that no problems, for instance, in terms of premature drying will occur during the application of the anti-adhesion material. Such a boiling point will, moreover, ensure that the solvent will be substantially completely removed or evaporated at a further increase in temperature.

For a particularly simple and reliable formulation of the anti-adhesion material according to the invention, it is proposed according to a further preferred embodiment that a cellulose derivative or a water-soluble and, preferably, alkali-saponifiable compound is contained as said binder.

To solve the above-mentioned objects, a method of the initially defined kind is, moreover, substantially characterized in that, in the region of the subsequent removal of the subportion or part, a portion kept free from direct bonding between the material layers is provided by applying an anti-adhesion or nonstick material according to the invention or a preferred embodiment of the same. By providing according to the invention, in the region of the subsequent division or removal of a subportion, a bond-free area by the application or arrangement of the anti-adhesion material according to the invention to prevent, in particular, the adherence of the subportion to be subsequently removed to the further material layer to be provided, a subsequent division of the material layer including the subportion to be removed can be reliably performed without observing extremely precise tolerances for the realization of the dividing step, for instance in respect to the division depth, for the subsequent removal of said subportion. By the provision of a bond-free area, it has, moreover, become possible to renounce, in particular, any preconfectioning and/or formatting of bonding-enabling layers in the region of the subsequent division and removal of the subportion such that preparation steps for the production or preparation of the material layers to be arranged and bonded, and of a layer to be used for bonding, will be facilitated. Due to the fact that the preconfectioning of an adhesive layer or bonding layer, or layer to be provided, can be renounced in the region of the subsequent division or removal of a subportion, it will, moreover, be feasible to even do with thin or thinner such intermediate layers or bonding layers of an adhesion-preventing material or anti-adhesion material between the metal layers to be bonded. It is, thus, feasible according to the invention to use substantially continuous material layers, wherein the adhesion-preventing portion for the formation of the bond-free area can be applied or provided in a simple manner.

In the context of the production of a printed circuit board, a miniaturization of such a printed circuit board and, in particular, a rigid-flexible printed circuit board will, in particular, be feasible by minimizing the overall printed circuit board to be produced, whereby even problems as described above in the context of the known prior art in respect to the registering accuracy when providing thick layers when requiring the necessary preconfectioning or formatting of intermediate layers will be reliably avoided.

In order to enable particularly simple processing of the anti-adhesion material according to the invention, it is proposed according to a preferred embodiment of the method according to the invention that the anti-adhesion material is subjected to a drying and/or curing process after its application. Such a drying and/or curing process can be performed as a function of the materials used for the anti-adhesion material and selected, in particular, in correspondence with the adjoining material layers.

In order to obtain desiredly thin layer thicknesses while maintaining the bond-free area of the subportion to be removed, or preventing the adherence of the same, as provided by the invention, it is proposed according to a further preferred embodiment that the anti-adhesion material is applied in a layer thickness of less than 25 μm and, in particular, less than 15 μm.

As already pointed out above several times, the method according to the invention, in particular, can be applied in a particularly beneficial manner in the production of a printed circuit board, in which context it is proposed according to a further preferred embodiment that the substantially flat material layers to be bonded are formed by layers of a multilayer printed circuit board.

In this context, it is, moreover, preferably proposed that the material layers to be bonded are bonded by a lamination process, whereby special requirements, particularly in connection with the production of a multilayer printed circuit board and the materials employed in the production of such a multilayer printed circuit board, can be taken into account due to the above-mentioned material properties of the anti-adhesion material according to the invention, for instance in terms of the softening point of the anti-adhesion material as well as the boiling point of the solvent contained in said material.

For a particularly reliable and simple removal or separation of the subportion to be removed after having bonded the flat material layers to be bonded, it is, moreover, proposed that edge regions of the subportion to be removed are defined and/or removed by milling, scratching, cutting, in particular laser-cutting, as in correspondence with a further preferred embodiment of the method according to the invention. Such milling, scratching, cutting or the like procedures can be accordingly precisely and reliably performed in conformation with the flat materials to be bonded, wherein even with the use of materials having slight thicknesses such as, for instance, in the context of the production of a multilayer printed circuit board, an accordingly precise and reliable performance of the dividing procedure will be feasible. As already pointed out above, the requirements in terms of tolerances to be observed, will, moreover, be accordingly reduced by the adhesion-prevention material layer.

To solve the above-mentioned objects, a multilayer structure of the initially defined kind is, moreover, essentially characterized in that, in the region of a subportion to be removed after having realized the bond between the material layers, an area kept free from direct bonding between the material layers to be bonded is provided by the application of an anti-adhesion material according to the invention or a preferred embodiment of the same. It is, thus, readily feasible to provide a bond between at least two substantially flat material layers, with the subsequent removal of a subportion to be removed being enabled by the provision and simple application of an adhesion-preventing material or anti-adhesion material. In addition, an enhanced orientation or registration of the substantially flat material layers to be bonded will be ensured.

For the simple formation of the bond-free area in the region of the subportion to be subsequently removed, of the substantially flat material layers to be bonded, it is proposed that the anti-adhesion material is comprised of a wax paste.

In order to achieve accordingly thin overall thicknesses of the multilayer structure according to the invention, it is, moreover, proposed that the anti-adhesion material is applied in a layer thickness of less than 25 μm and, in particular, less than 15 μm, as in correspondence with a further preferred embodiment of the multilayer structure according to the invention.

According to a further preferred embodiment, it is, moreover, proposed that the substantially flat material layers to be bonded are formed by layers of a multilayer printed circuit board.

A particularly reliable bond will be provided in that the material layers to be bonded are bonded by a lamination process.

The reliable removal of the subportion to be removed after bonding of the substantially flat material layers to be bonded will, moreover, be achieved in that edge regions of the subportion to be removed are definable and/or removable by milling, scratching, cutting, in particular laser-cutting, as in correspondence with a further preferred embodiment of the multilayer structure according to the invention.

As already pointed out several times, it is, moreover, proposed according to the invention that the anti-adhesion material according to the invention or a preferred embodiment of the same and/or the method according to the invention or a preferred embodiment of the same and/or the multilayer structure according to the invention or a preferred embodiment of the same are used for the production of a multilayer printed circuit board.

In particular, in the context of such a use according to the invention, it is, moreover, proposed in a preferred manner to use the method according to the invention, or the multilayer structure according to the invention, for the production of cavities, in particular three-dimensional cavities, in a printed circuit board.

Further preferred uses of the method according to the invention and/or the multilayer structure according to the invention include the production of at least one channel in a printed circuit board, a bond-free area for the production of cavities, in particular three-dimensional cavities, in a printed circuit board, the production of offset and/or stepped subportions of a printed circuit board, the non-bonding of at least one element, in particular registering element, in the interior or within inner layers of a multilayer printed circuit board, and/or the production of a rigid-flexible printed circuit board.

SHORT DESCRIPTION OF THE DRAWINGS

In the following, the invention will be explained in more detail by way of exemplary embodiments schematically illustrated in the accompanying drawing, of the method according to the invention for producing a multilayer structure according to the invention by using the anti-adhesion material according to the invention.

Therein:

FIG. 1 is a schematic section through a first embodiment of a flat material layer of a multilayer structure to be produced according to the invention, in the form of a rigid portion of a rigid-flexible printed circuit board as a multilayer structure according to the invention;

FIG. 2, in an illustration similar to that of FIG. 1, illustrates a section through the rigid portion of a rigid-flexible printed circuit board, wherein milling edges are provided in the region of a subsequent division of the rigid portion subportion to be removed;

FIG. 3, in an illustration similar to those of FIGS. 1 and 2, depicts a section through the rigid portion of a rigid-flexible printed circuit board, wherein an anti-adhesion material according to the invention is provided or applied in the region of the subsequent division as well as the milling edges, for the formation of a bond-free area to prevent direct bonding between the substantially flat material layers formed by the rigid portion and the flexible portion of the printed circuit board;

FIG. 4 illustrates another section again similar to those of the preceding Figures, wherein a layer of non-conductive or dielectric material and a flexible portion of the rigid-flexible printed circuit board as a second substantially flat material layer are arranged on, or fixed to, the rigid portion of the first material layer;

FIG. 5 in a further similar section depicts the multilayer structure according to the invention in the form of a rigid-flexible printed circuit board after the division of the rigid portion;

Figure 7:
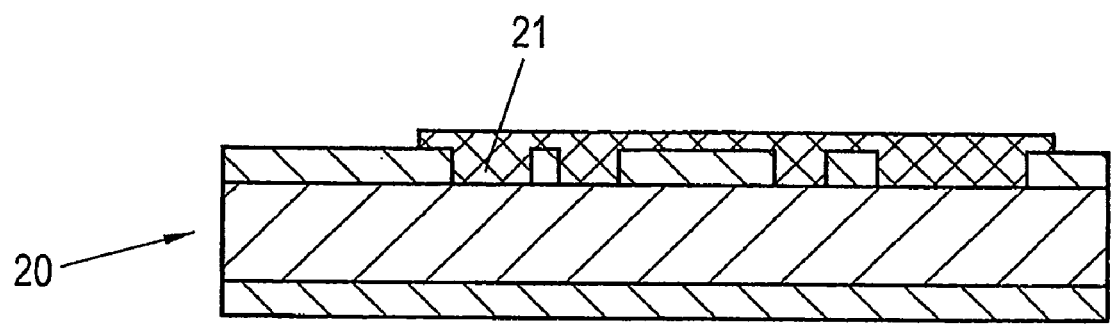
FIG. 7 depicts a schematic section through the flat material layer illustrated in FIG. 6, with a layer of an adhesion-preventing material or anti-adhesion material according to the invention being applied.
Figure 8:
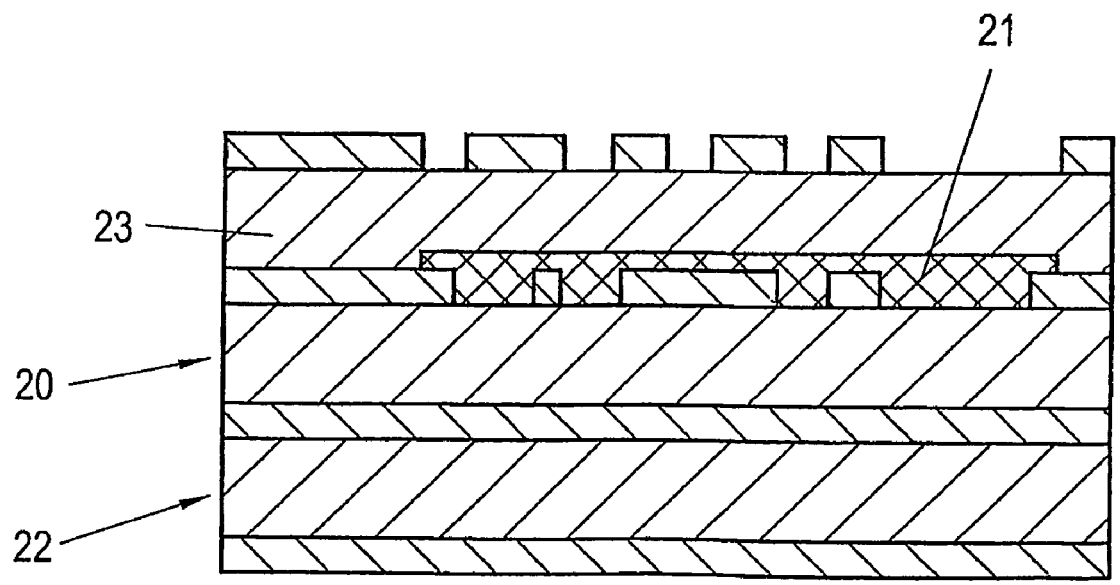
Figure 9:
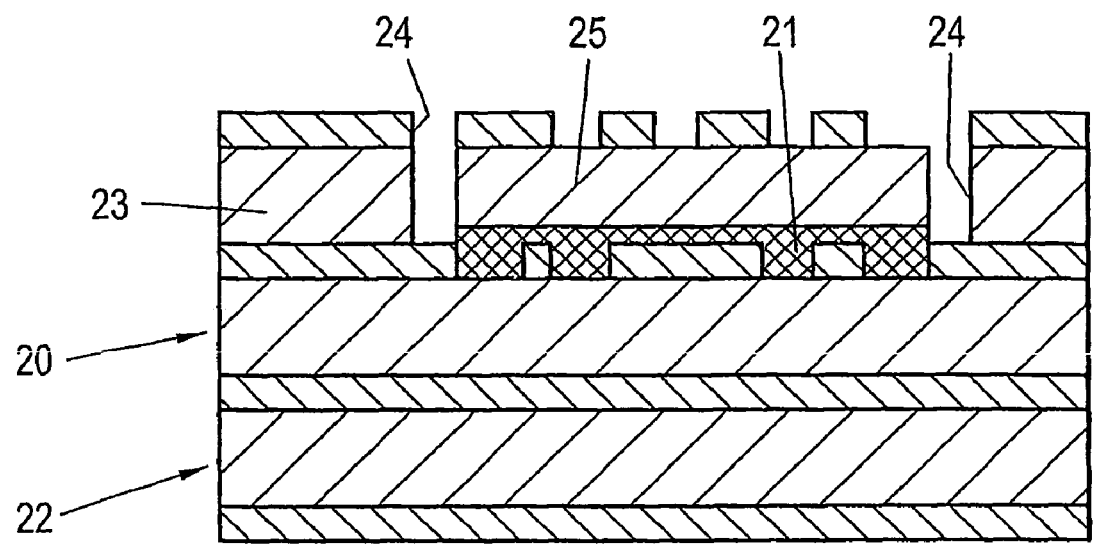
Figure 10:
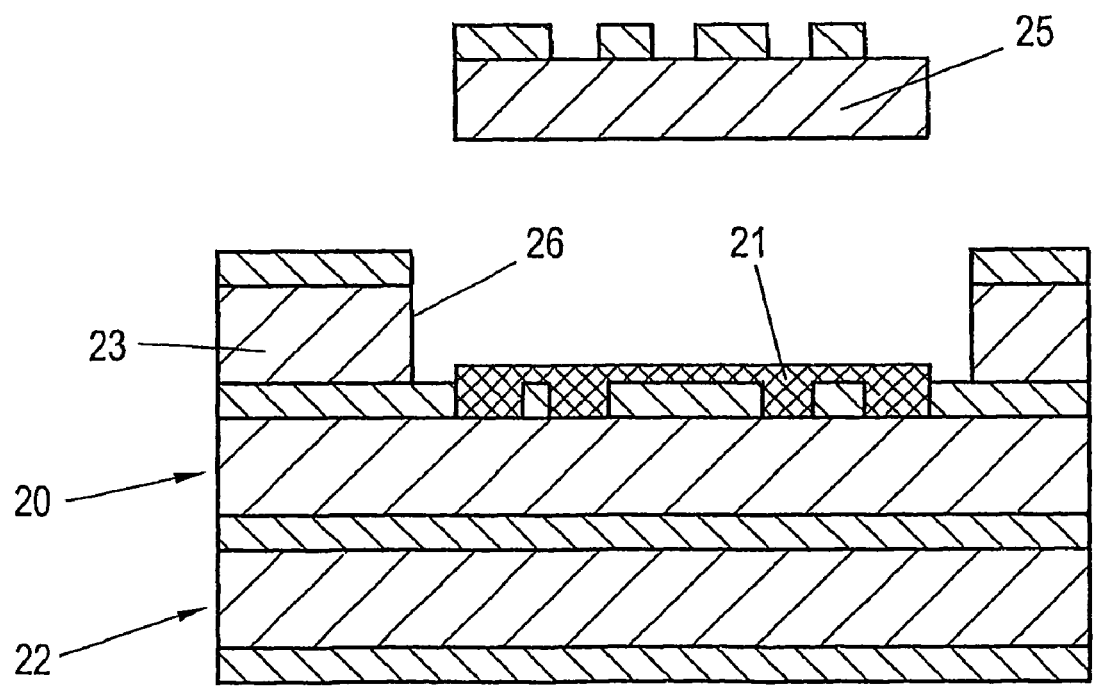

FIG. 8 depicts schematic section through the flat material layer illustrated in FIGS. 6 and 7, which is bonded with at least one further flat material layer to produce a multilayer printed circuit board as a multilayer structure according to the invention, FIG. 9, in an illustration similar to that of FIG. 8, depicts a schematic section through the subportion of the multilayer structure to be subsequently removed, which is delimited or defined by cutting; and FIG. 10 is an illustration similar to that of FIG. 9, with the cut or delimited subportion being removed.

DETAILED DESCRIPTION OF PREFERRED EMBODIMENTS

A first embodiment of a multilayer structure according to the invention, which is produced as a rigid-flexible printed circuit board using the method according to the invention and an anti-adhesion material according to the invention, is described with reference to FIGS. 1 to 5.

Figure 1:
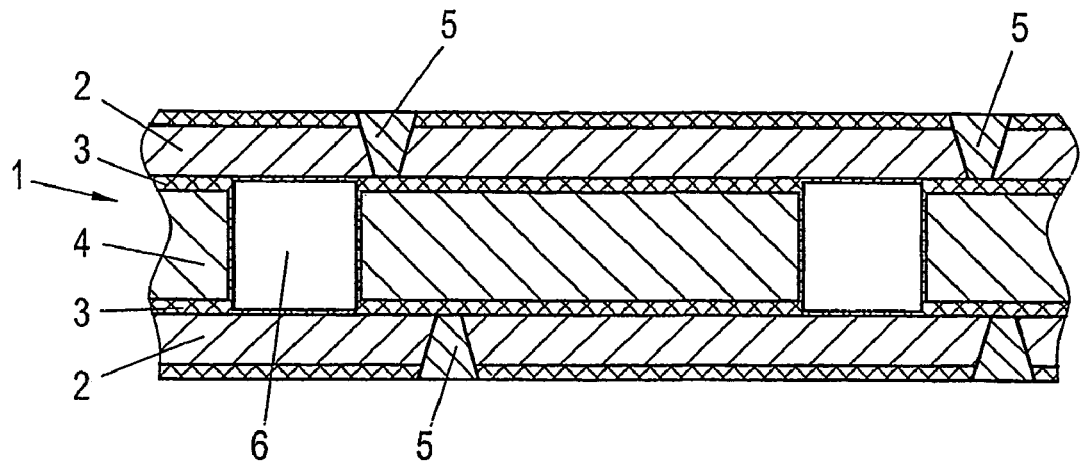

FIG. 1 is a schematic illustration of a rigid, multilayer portion 1 as a first substantially flat or planar material layer of a rigid-flexible printed circuit board to be subsequently produced as a multilayer structure. Individual metal or copper layers 2 are, for instance, separated by prepreg layers 3 and a core 4. Connections between the individual copper layers 2 are indicated via microvias 5 and passages 6, respectively.

Figure 2:
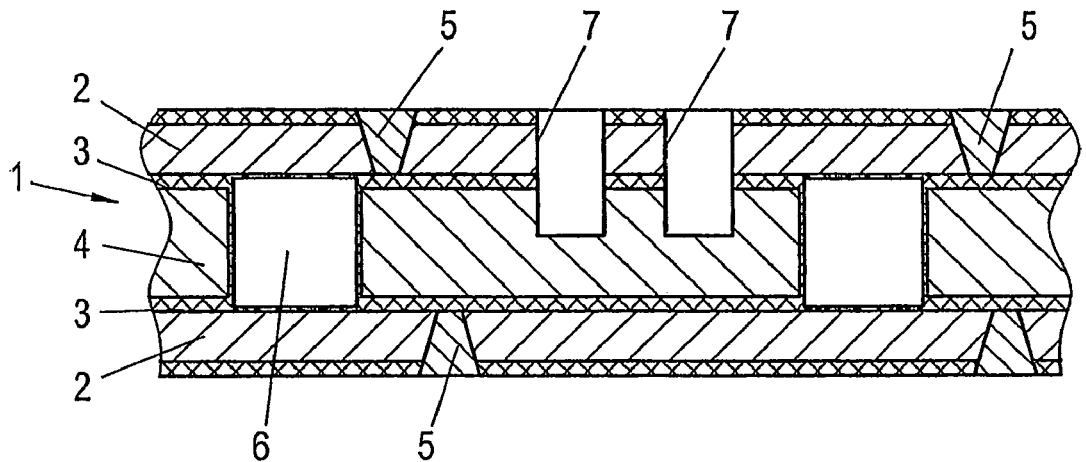
Figure 3:
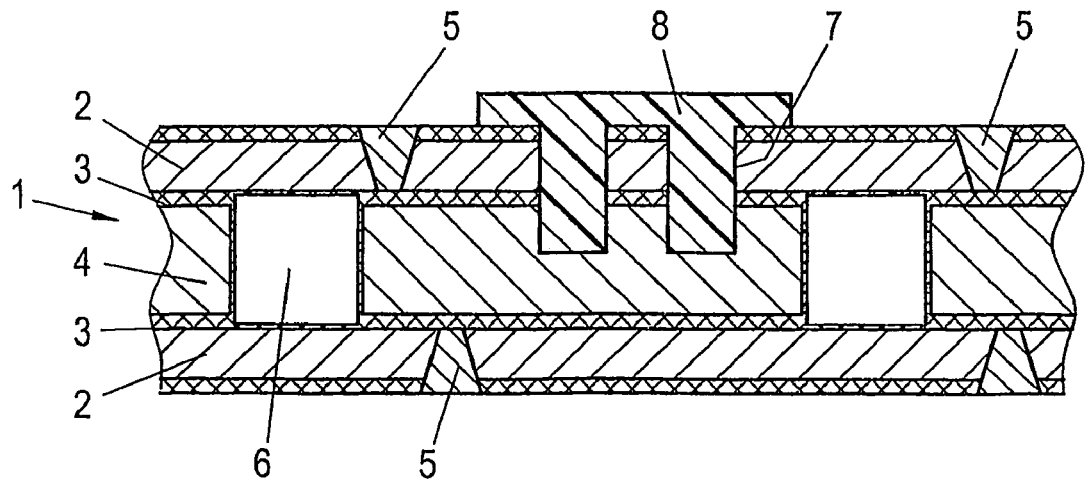

For the production of a rigid-flexible printed circuit board, milling edges 7 are formed in the region of a subsequent division of the rigid multilayer portion 1 of the rigid-flexible printed circuit board to be produced, as indicated in FIG. 2.

In order to provide a bond-free area, or prevent direct bonding between the printed circuit board rigid portion 1 to be subsequently divided and a layer of non-conductive or dielectric material to be provided and arranged as a second substantially flat material layer of the printed circuit board for bonding with a flexible portion, a material preventing such an adhesion or anti-adhesion material 8 is provided following the formation of the milling edges 7, in the region of the subsequent division and in the channels or grooves formed by the milling edges 7 in the embodiment depicted in FIGS. 1 to 5. The anti-adhesion or nonstick material may, for instance, be comprised of a waxy paste 8, such a waxy paste 8 being applied, or introduced, in the region of the subsequent division as well as into the milling edges 7 by simple method steps, e.g. by a printing process, in particular screen-printing or stencil-printing. Depending on the material 8 used, or the waxy paste, a drying and/or curing process may be provided following the application of the material or paste 8.

The material or paste 8 can be applied in the form of a micro-dispersion in polar or nonpolar organic solvents. For the simple processability and for simple handling, it is, moreover, provided that the paste 8 is, for instance, comprised of polyethylene waxes, polypropylene waxes, Teflon-based waxes and/or mixtures thereof.

To further enhance the processability, it may, moreover, be contemplated that the paste 8 is provided with inorganic and/or organic fillers and/or additives.

In order to achieve accordingly thin layer thicknesses or overall thicknesses of the rigid-flexible printed circuit board to be produced, it is, moreover, provided that the paste or anti-adhesion material 8 is applied in a layer thickness of less than 25 μm and, in particular, less than 15 μm in the region of the subsequent division.

Further exemplary embodiments of an anti-adhesion material to be used will be given below.

While, in the embodiment represented in FIGS. 1 to 5, the formation of milling edges 7 is provided prior to the application of the anti-adhesion material or paste 8, the paste 8 may alternatively be applied in the region of the subsequent division of the rigid and, in particular, multilayer porion of the printed circuit board, after which the milling edges 7 will subsequently pass through the applied material 8.

Figure 4:
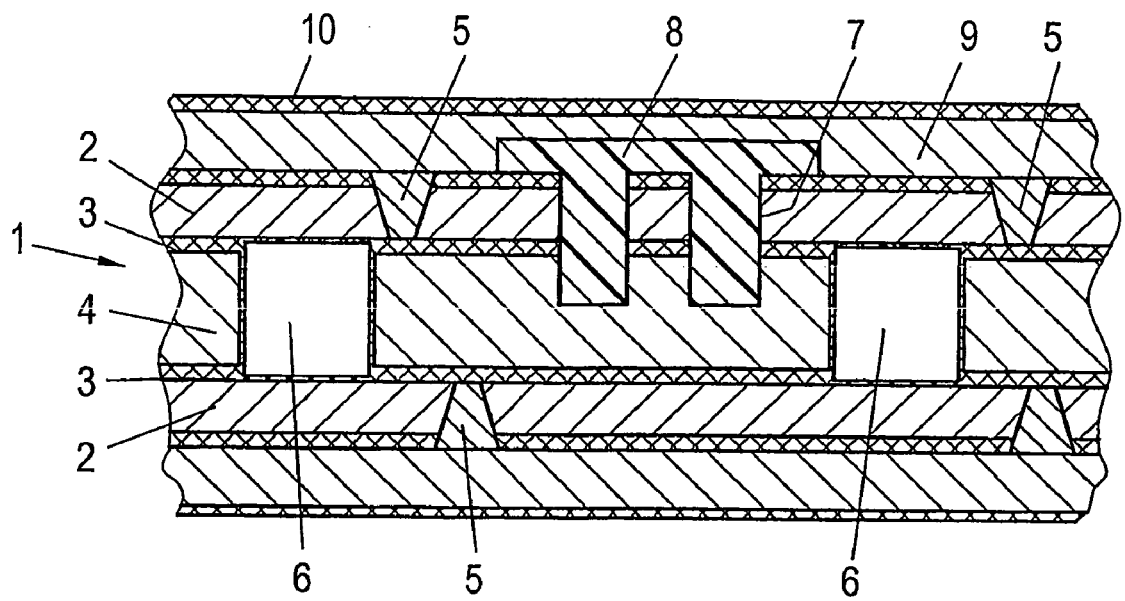

As depicted in FIG. 4, the application of the anti-adhesion material or waxy paste 8 in the region of the subsequent division as well as the milling edges 7 is followed by the application or arrangement of a bonding layer 9 of non-conductive or dielectric material, said bonding layer 9 being, for instance, comprised of a foil known per se, for instance a prepreg or RCC foil, or even a liquid dielectric material. Following the layer 9 of non-conductive or dielectric material, a flexible subportion 10 of the rigid-flexible printed circuit board to be produced is indicated, wherein the flexible portion 10 of the rigid-flexible printed circuit board to be produced, like the rigid portion 1, may be comprised of several layers.

By the arrangement of the anti-adhesion material 8 or waxy paste, preconfectioning and/or formatting for the non-conductive or dielectric material layer 9 to be provided can be renounced, in particular, in the region of the subsequent division in the region of the milling edges 7 such that preparation steps for the non-conductive or dielectric material layer 9 to be provided will be simplified or reduced.

By providing the bond-free area in the region of the application of the material 8 on the rigid portion 1 of the rigid-flexible printed circuit board to be produced, thinner layer thicknesses of the layer 9 will, moreover, do, said thickness being, for instance, selected to be less than 50 μm and, in particular, 40 μm or less. The provision of such thin layer thicknesses of the layer of non-conductive material to be arranged between the rigid portion 1 and the flexible portion 10 of the rigid-flexible printed circuit board to be produced will not only promote a reduction of the overall thickness of the rigid-flexible printed circuit board to be produced, but the positioning and registering accuracy of the portions to be bonded and of subsequent passages or microvias will also be enhanced.

Figure 5:
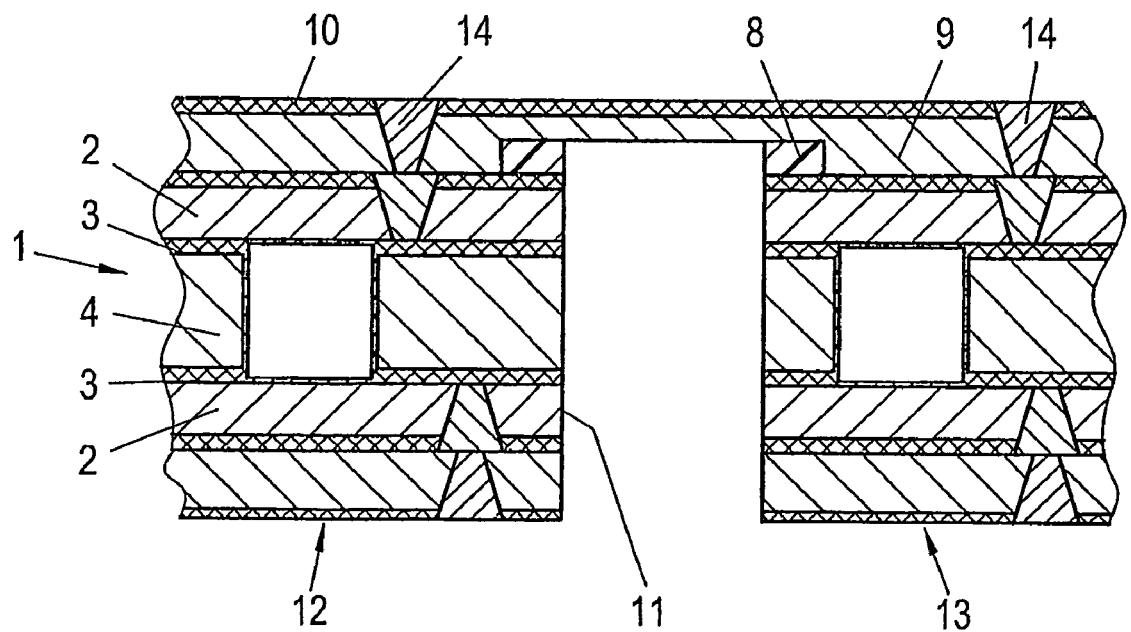

FIG. 5 represents a section through the rigid-flexible printed circuit board formed by the rigid portion 1 and the flexible portion 10 as a multilayer structure, wherein a division 11 has been made between the then separated rigid subportions 12 and 13 in the region of the milling edges 7. Said division 11 constitutes a subportion to be subsequently removed after bonding of the flat material layers. It is, moreover, indicated that a connection between the flexible portion 10 of the printed circuit board and the then separated rigid subportions 12 and 13 is achievable by additional microvias or passages 14.

As is further apparent from the illustration according to FIG. 5, it is possible, without having to consider or observe very precise tolerances in terms of the cutting depth of the division or subportion 11 to be removed, to facilitate also the production of the division and, hence, subsequent method steps by providing the non-bonding surface, or preventing bonding, through the application of the anti-adhesion material 8.

By the appropriate choice of the anti-adhesion material or waxy paste 8 and the layer 9 of non-conductive or dielectric material to be arranged between the rigid portion 1, or subsequently separated rigid portions 12 and 13, respectively, and the flexible portion 10 of the printed circuit board, it will be readily feasible to take into account legal limitations required when using specific hazardous substances in electric and electronic equipment.

By providing the bond-free area through the application of an anti-adhesion material or waxy paste 8, simple method steps will do, in particular, in the preparation or production of the layer 9 to be arranged between the flexible portion 10 and the rigid portion 1 as well as in subsequent method steps for realizing the division.

By using thin layer thicknesses for bonding the flexible portion 10 as well as the rigid portion 1, and the mutually separated rigid portions 12 and 13, respectively, and the thus achievable thin layer thickness as well as the hence resulting improvements in the registering accuracy, it has, moreover, become possible to provide printed circuit boards with flexible layers 10 for highly complex components even in large formats, for instance in the production format of HDI circuit boards of more than 18×24 inch.

The embodiment of a multilayer rigid printed circuit board, or rigid portion 1 of a printed circuit board, which is depicted in FIGS. 1 to 5, for illustration purposes merely represents a simplified example of such a multilayer printed circuit board as a multilayer structure, wherein also a larger number or plurality of, in particular, conductive layers 2 and feedthroughs via microvias 5 or passages 6 and 14, respectively, may be employed as a function of the desired complexity of the component to be produced.

Figure 6:
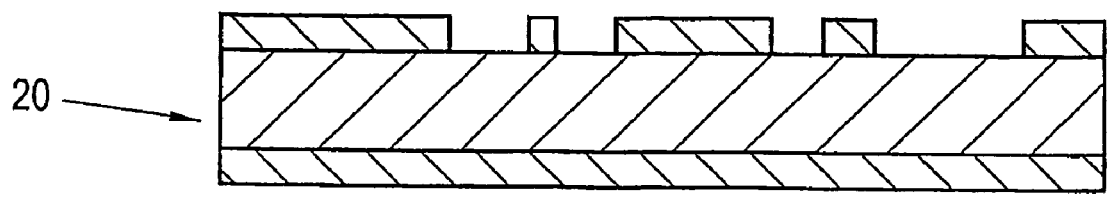
FIG. 6 is a schematic section through a modified embodiment of a substantially flat material layer of a printed circuit board as a multilayer structure according to the invention to be produced by the method of the invention.

In the exemplary embodiment illustrated in FIGS. 6 to 10, of a modified multilayer structure, again in the form of a multilayer printed circuit board to be produced, a structured core of such a printed circuit board is generally denoted by 20, which core 20 comprises several layers with, in particular, the upper layer depicted in FIG. 6 being structured accordingly.

The core 20, which is comprised of one or several layer(s) and constitutes a substantially flat material layer, in a subportion is subsequently provided with an adhesion-preventing material or anti-adhesion material 21 for bonding with further layers as additional substantially flat material layers, as illustrated in FIG. 7, said anti-adhesion material being, for instance, applied by screen-printing.

Following the application of the adhesion-preventing material 21 on the substantially flat material layer formed by the core 20 as illustrated in FIG. 7, bonding in a manner known per se, for instance by a lamination process, of the flat core 20 with a plurality of again substantially flat material layers 22 and 23 is effected, the subportion provided with the anti-adhesion material being again denoted by 21 in FIG. 8. The flat material layer 23 illustrated in FIG. 8 may again be accordingly structured on its upper surface.

After the bonding procedure illustrated in FIG. 8, between the plurality of substantially flat material layers 20, 22 and 23, a delimitation or definition of a subportion 25 of the substantially flat material layer 23 is effected, for instance, by cutting, in particular laser cutting, while forming cutting lines or impressions 24, as is apparent from FIG. 9. The anti-adhesion material 21 provided below the subportion 25 to be removed renders feasible in a simple manner, after the formation of the cutting line or delimiting impressions 24, the simple and reliable removal of the subportion 25, as is illustrated or indicated in FIG. 10.

In the embodiment depicted in FIGS. 6 to 10, additional layers are indicated between the individual substantially flat material layers, which additional layers are known as such in the context of the fabrication of a multilayer printed circuit board and, therefore, not discussed in detail.

Also from the embodiment according to FIGS. 6 to 10, it is clearly apparent that the bond-free area provided in the context of bonding substantially flat materials or material layers 20, 22 and 23 by applying an anti-adhesion material 21 comprised, for instance, of a wax paste will subsequently allow for the simple and reliable removal of subportions 25 of at least one substantially flat layer 23 to be bonded therewith.

The cutting and, for instance, laser cutting operation illustrated and discussed in FIG. 9 may, for instance, be replaced with a milling operation as described in the embodiment according to FIGS. 1 to 5, or by scratching or a similar dividing operation of the at least one material layer 23.

From the embodiment according to FIGS. 6 to 10, it is apparent that a cavity 26 and, in particular, three-dimensional cavity can, for instance, be created in subportions or individual layers of a multilayer printed circuit board by removing a subportion 25.

It is, moreover, possible to use such a cavity 26 formed by the removal of the subportion or element 25 for the subsequent arrangement of separated elements in interior regions or inner layers of a multilayer printed circuit board.

In addition, the removal of subportions allows for the fabrication of a printed circuit board with offset and/or stepped subportions for special applications.

The adhesion-prevention material or anti-adhesion material 8 and 21, respectively, besides the materials mentioned in the above-described embodiments, may, for instance, also comprise hydrocarbon waxes and oils, waxes and oils based on polyethylene or polypropylene compounds, waxes and oils based on organic polyfluoro compounds, esters of fatty acids and alcohols or polyamides, silicoorganic compounds and/or mixtures thereof.

Instead of forming a multilayer structure of a multilayer printed circuit board, as disclosed in the above-described exemplary embodiments, such multilayer structures may also be formed by materials different from the materials used for the production of a printed circuit board, such as, e.g., foils or sheet- or plate-shaped materials. After or during the simple and reliable bonding of substantially flat material layers, wherein the preconfectioning or formatting of, for instance, adhesive or bonding foils is renounced for the bonding layer, it is possible, following such a simplified bonding of substantially continuous material layers, to simply and reliably remove subportions by providing or applying the anti-adhesion material 8 or 21, respectively.

In addition to the printing methods, e.g. screen-printing, mentioned in the above exemplary embodiments for the application of the anti-adhesion material 8 or 21, respectively, offset printing, flexoprinting, tampon printing, ink-jet printing or the like may be provided or used, in particular, as a function of the nature of the anti-adhesion material.

For the reliable separation or removal of the portion 11 or 25, respectively, to be subsequently removed, it is to be taken care, in particular, when using the anti-adhesion material 8 or 21, particularly in the form of a waxy paste, that this anti-adhesion material exhibits an appropriate difference in polarity as well as an incompatibility with the adjoining substantially flat material layer(s).

In the context of the production of a printed circuit board, polarity differences and incompatibilities with epoxy resins, phenolic resins and copper as frequently used layers of a multilayer printed circuit board are, for instance, to be taken into account.

By the option provided by the invention, of a structured application of the anti-adhesion material 8 or 21, subsequent methods steps, in particular in connection with the removal of subsequently removable subportions 11 or 25 of a multilayer structure, will be facilitated in a simple manner.

By using, for instance, an anti-adhesion material layer 8 or 21 which is applicable by simple printing techniques, formatting and confectioning techniques as are provided in the prior art, for instance for separation foils, can be obviated.

When using a waxy paste for the anti-adhesion material 8 or 21, it is, moreover, advantageous that residues of the anti-adhesion material 8 or 21 optionally remaining after the removal of, for instance, subportion 11 or 25, can again be removed in a simple and reliable and, in particular, complete manner.

Such a removal of the anti-adhesion material 8 or 21 after the removal of subportion 11 or 25, may, for instance, be effected by the aid of wet-chemically or mechanically abrasive methods or even lasers so as to ensure the complete removal of said material 8 to 21. After having removed the material 8 to 21, structures located below said material 8, such as, e.g., pads, conductor tracks, blind-hole bores etc. may be used for contacting further components.

In particular, in the context of the production or processing of printed circuit boards, non-bonding or the provision of an anti-adhesion material 8 or 21 will enable the formation of a space 26 for additional components, for instance by a local thickness reduction, as already mentioned above. Such a provision of a space 26, in particular and substantially in the interior of such a multilayer printed circuit board will, moreover, enable a reduction of the overall thickness of such a multilayer printed circuit board by the embedment of such components so as to take into account the requirements of a miniaturization of printed circuit boards.

By a local thickness reduction, it has, for instance, become possible to contact additional components to be arranged in the region of the removed subportion 25, in particular after the removal of the optionally remaining anti-adhesion material 21, as indicated in FIG. 10, directly on the bottom of such a recess or cavity 26. In doing so, it is, for instance, possible in a simple manner to arrange the respective contact elements or conductive structures, in case of the material layer 20 provided in FIG. 6, in the region of the cavity 26 to be subsequently produced, as is illustrated in FIG. 10.

As already pointed out above, the subsequent removal of subportions 25 while forming cavities 26 will also render feasible the provision of accordingly three-dimensional open or optionally closed cavities, wherein it is feasible, for instance when departing from the condition represented in FIG. 10, to provide further layers of a multilayer printed circuit board.

By the appropriate choice or arrangement of the anti-adhesion material 8 to 21, it is, moreover, possible to enable the formation of cavities 26 over several layers of such a multilayer conductor structure, as is, for instance, indicated in FIG. 5 with reference to the first embodiment.

In the context of the production of printed circuit boards, it is, thus, for instance, also possible, by removing subportions 25, to provide an accordingly simplified non-bonding of registering elements.

The formation of stepped or offset subportions, for instance, allows for the creation of interleaved or overlapping portions of a multilayer printed circuit board.

By the removal of subportions through the application of an adhesion-preventing material or anti-adhesion material 8 or 21 it will, moreover, for instance, be feasible to provide repair options of already existing or populated printed circuit boards with embedded components, if, for instance, an anti-adhesion material is accordingly provided as a precaution in the region of components optionally subject to high failure or damage rates so as to enable the repair of a printed circuit board by the removal of a subportion in the event of a defect of such a component rather than requiring its complete substitution, thus enabling the simple exchange of components and the simple provision of a multilayer structure comprised of at least two substantially flat material layers to be bonded.

In the following, several exemplary embodiments of the adhesion-preventing material or anti-adhesion material will be described.

EXAMPLE 1

50 g of an acrylic thickener were diluted with 370 g water, and 5.5 g 25% ammonia solution were added under stirring. The viscous varnish formed was used as a binder for the anti-adhesion material to be produced.

200 g polyethylene wax powder were dispersed in 200 g of the above-prepared binder by the aid of a vacuum mixer. Such a formulation or anti-adhesion material is particularly suitable for being applied by screen-printing.

EXAMPLE 2

Departing from a binder according to Example 1, an anti-adhesion material based on a polyethylene/carnauba wax mixture was produced in a manner similar to Example 1.

EXAMPLE 3

As in Example 1, 50 g of an acrylic thickener were diluted with 370 g water to form a binder for use with oily or waxy components. Instead of adding n ammonia solution, this mixture was saponified with 2 g 20% soda lye.

An anti-adhesion material produced with such a binder exhibits an enhanced resolubility in a printing process.

EXAMPLE 4

Departing from the binder according to Example 1, the binder was saponified with 5 g triethanolamine instead of adding an ammonia solution. An anti-adhesion material produced with such a binder likewise exhibits an enhanced resolubility in a printing process.

EXAMPLE 5

A binder mixture based on a solvent was prepared by dissolving 10.8 g ethylcellulose in 89.2 g ethoxypropanol. The viscous varnish formed was used as a binder for the production of anti-adhesion materials.

40 g polyethylene wax powder were added to 160 g of the above-prepared binder and dispersed by the aid of a vacuum mixer.

Such an anti-adhesion material is suitable for being applied by a printing process, in particular screen-printing process, and, in particular, exhibits good rheological properties.

EXAMPLE 6

A binder mixture based on a solvent was prepared by dissolving 36 g ethylcellulose in 384 g DPGMA (dipropyleneglycol methylether acetate). The viscous varnish formed was used as a binder for the production of anti-adhesion materials.

180 g polyamide wax powder were dispersed in 420 g of the above-prepared varnish or binder by the aid of a vacuum mixer.

A formulation suitable for screen-printing and exhibiting good rheological properties, a good resolubility and printability as well as processability was obtained.

In order to enhance the visibility of the mixture, a dye, for instance 2 g of a soluble dye, e.g. Neozapon Blue 807, was added.

EXAMPLE 7

The DPGMA used for the preparation of the binder was replaced with a naphthenically aromatic solvent.

The further formulation of the anti-adhesion material corresponds to that of Example 6.

EXAMPLE 8

To produce an anti-adhesion material, a silicone resin was dissolved in an appropriate solvent.

EXAMPLE 9

A thermally polymerizable silicone is directly used as an anti-adhesion material.

The invention claimed is:

1. A method for removing a part or a subportion of a first substantially flat or planar material layer from a second substantially flat or planar material layer, the first substantially flat or planar material layer being bonded with at least the second substantially flat or planar material layer in a bonding procedure by raising the temperature, the method comprising the steps of:
   applying an anti-adhesion or nonstick material to a region of the first or the second substantially flat or planar material layers, the region being subject to subsequent removal and being kept free from direct bonding between the first and second substantially flat or planar material layers;
   subjecting the anti-adhesion material to a drying or curing process after its application;
   binding the first and second substantially flat or planar material layers; and
   removing the part or the subportion of the first substantially flat or planar material layer;
   wherein the anti-adhesion material comprises a difference in polarity relative to the first and second substantially flat or planar material layers.

2. The method according to claim 1, wherein the anti-adhesion material is applied in a layer thickness of less than 25 μm.

3. The method according to claim 1, wherein the first and second substantially flat material layers to be bonded are formed by layers of a multilayer printed circuit board.

4. The method according to claim 1, wherein the material layers to be bonded are bonded by a lamination process.

5. The method according to claim 1, wherein edge regions of the subportion to be removed are defined or removed by milling, scratching, or cutting.

* * * * *

UNITED STATES PATENT AND TRADEMARK OFFICE
CERTIFICATE OF CORRECTION

PATENT NO. : 8,388,792 B2  
APPLICATION NO. : 12/449606  
DATED : March 5, 2013  
INVENTOR(S) : Weidinger et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 685 days.

Signed and Sealed this
First Day of September, 2015

Michelle K. Lee
*Director of the United States Patent and Trademark Office*